(12) United States Patent
Quoc et al.

(10) Patent No.: US 7,557,657 B2
(45) Date of Patent: Jul. 7, 2009

(54) VARIABLE GAIN AMPLIFIER WITH WIDE GAIN VARIATION AND WIDE BANDWIDTH

(75) Inventors: Hoang Duong Quoc, Daejeon (KR); Sang Gug Lee, Daejeon (KR); Jeong Hoon Kim, Gyunggi-do (KR); Tah Joon Park, Gyunggi-do (KR); Eung Ju Kim, Gyunggi-do (KR)

(73) Assignees: Samsung Electro-Mechanics Co., Ltd., Suwon, Gyunggi-Do (KR); Information and Communications University Research and Industrial Cooperation Group, Daejeon (KR)

( * ) Notice: Subject to any disclaimer, the term of this patent is extended or adjusted under 35 U.S.C. 154(b) by 70 days.

(21) Appl. No.: 11/775,105

(22) Filed: Jul. 9, 2007

(65) Prior Publication Data
US 2008/0018401 A1  Jan. 24, 2008

(30) Foreign Application Priority Data
Jul. 10, 2006  (KR) ...................... 10-2006-0064474

(51) Int. Cl.
*H03F 3/45* (2006.01)
(52) U.S. Cl. ........................................ 330/254; 330/69

(58) Field of Classification Search .................. 330/254, 330/257, 261, 69
See application file for complete search history.

(56) References Cited

U.S. PATENT DOCUMENTS

| | | | | | |
|---|---|---|---|---|---|
| 4,415,864 | A | * | 11/1983 | Boeke | 330/253 |
| 5,198,780 | A | * | 3/1993 | Kase | 330/254 |
| 5,594,386 | A | * | 1/1997 | Dhuyvetter | 330/251 |
| 6,630,864 | B2 | * | 10/2003 | Yang | 330/254 |

* cited by examiner

*Primary Examiner*—Henry K Choe
(74) *Attorney, Agent, or Firm*—Lowe Hauptman Ham & Berner

(57) ABSTRACT

A variable gain amplifier including: a differential amplification unit amplifying and outputting a difference between a first input signal and a second input signal inputted via a first input terminal and a second input terminal, respectively, according to a first bias current of the first input terminal and second input terminal, to a first output terminal and a second output terminal; a diode-connected load unit comprising loads diode-connected to the first output terminal and second output terminal, respectively, the load receiving a second bias current; and a gain control unit controlling a gain between the input terminals and the output terminals of the differential amplification unit by controlling the size of the first bias current and second bias current.

16 Claims, 10 Drawing Sheets

VARIABLE GAIN AMPLIFIER WITH WIDE GAIN VARIATION AND WIDE BANDWIDTH

CROSS-REFERENCE TO RELATED APPLICATIONS

This application claims the priority of Korean Patent Application No. 2006-64474 filed on Jul. 10, 2006, in the Korean Intellectual Property Office, the disclosure of which is incorporated herein by reference.

BACKGROUND OF THE INVENTION

1. Field of the Invention

The present invention relates to a variable gain amplifier, and more particularly, to a variable gain amplifier having a large width of gain variation, a large bandwidth, and a temperature-independent gain.

2. Description of the Related Art

In general, variable gain amplifiers (VGAs) are used to provide a variable gain required in various electronic apparatus such as disk drives, hearing aids, medical equipments, and communication apparatuses. Since the amplitude of signals used for electronic apparatuses may have to be largely changed, gain variation in a range as wide as possible is required. For example, code division multiple access (CDMA) communication systems require a gain variation range of approximately 80 dB. That is, in a dB scale, a section in which a gain is linearly formed has to be wide.

Amplifiers having a variable gain linear in a dB scale may be easily obtained by applying a bipolar transistor providing an exponential current-voltage relationship. However, since complementary metal-oxide semiconductor (CMOS) transistors have approximately linear current-voltage characteristics, it is difficult to embody a variable gain amplifier linear in a dB scale, based on CMOS. Accordingly, a CMOS-based variable gain amplifier is embodied to have an exponential equation whose gain is approximated.

As well-known approximated exponential equations, there are Equations 1 and 2. Equation 1 is a Taylor approximation function that is a Taylor series expansion, and Equation 2 is a pseudo-exponential function.

$$f(x) = 1 + x + \frac{1}{2!}x^2 \quad \text{Equation 1}$$

$$f(x) = \frac{1+x}{1-x} \quad \text{Equation 2}$$

FIG. 1 is a graph illustrating curves of dB scales according to Equations 1 and 2. Referring to FIG. 1, there are linear errors less than ±0.5 dB between Equations 1 and 2 and an ideal exponential function shown as a dotted line in FIG. 1, in a range of approximately 12 to 15 dB, respectively. That is, Equation 1 has a dB-linear section about 12 dB and Equation 2 has a dB-linear section about 15 dB. That is, a variable gain amplifier having a gain according to Equations 1 and 2 may change the gain only in the range of 12 dB and 15 dB, respectively.

FIG. 2 is a circuit diagram illustrating a conventional variable gain amplifier to which Equation 2 is applied. Referring to FIG. 2, the conventional variable gain amplifier includes a differential amplification unit 21 including two metal-oxide semiconductor (MOS) transistors M21 and M22 and diode-connected loads M23 and M24 connected to output terminals of the differential amplification unit 21. A differential gain of the variable gain amplifier of FIG. 2 is $g_{m\text{-}M21,M22} \times \text{Rout}$. In this case, $g_{m\text{-}M21,M22}$ is a transconductance of a pair of input differentials M21 and M22 and Rout is an output impedance. Since an output of the variable gain amplifier is diode-connected loads M23 and M24, the Rout is proportional to $1/g_{m\text{-}M23,M24}$. In this case, $g_{m\text{-}M23,M24}$ is a transconductance of the diode-connected loads M23 and M24. A gain variation may be obtained by controlling bias currents of the pair of input differentials M21 and M22 and loads M23 and M24. A gain of the variable gain amplifier of FIG. 2 is as Equation 3.

$$A_V = \frac{g_{m\text{-}M21,M22}}{g_{m\text{-}M23,M24}} = \sqrt{\frac{(W/L)_{M21,M22}}{(W/L)_{M23,M24}}\left(\frac{1+x}{1-x}\right)} \quad \text{Equation 3}$$

Equation 3 is similar to the pseudo-exponential function shown in Equation 2. That is, the variable gain amplifier of FIG. 2 is designed based on Equation 2 and thus may provide 15 dB as a range having a linear error less than ±0.5 dB.

To extend a narrow width of the variable gain amplifier, generally, the variable gain amplifier has been embodied as multi-stage. As a result, much more power has been consumed, a larger chip area is required, and low noise characteristics and linearity have been generated. Particularly, as more gain stages are used, the noise characteristics and linearity are more deteriorated.

On the other hand, considering a frequency response of a circuit shown in FIG. 2, a bandwidth of the variable gain amplifier is determined by an input pole and an output pole. Since an output load is a diode-connected transistor, the output pole generally depends on the bias current of the transistors M23 and M24. When a gain is determined to be low, $I_0(1-x)$ and the bandwidth are extended. However, when the gain is determined to be high, $I_0(1-x)$ and the bandwidth are reduced. The input pole is a function of an input capacitance. In FIG. 2, an overall capacitance of an input terminal of the MOS transistor M21 is identical with a value obtained by adding a Miller multiplication of a capacitance $C_{GD}$ between a gate and a drain to a capacitance $C_{GS}$ between the gate and a source, that is, identical with $C_{GS}+(1+|A_v|)C_{GD}$. As a result, the input pole is proportional to the gain. Accordingly, when the gain is determined to be high, the bandwidth is notably reduced.

Accordingly, in the field of the art, a variable gain amplifier is required, the amplifier having a reduced number of stages and a wide gain variation width and capable of providing a wide bandwidth at a high gain to consume a small amount of bias current and a small chip area.

SUMMARY OF THE INVENTION

To solve the problems of the conventional art, an aspect of the present invention provides a variable gain amplifier having a wide variation width of a gain variation width without increasing the number of a plurality of stages providing gains.

An aspect of the present invention also provides a variable gain amplifier having a small decrease of a bandwidth at a high gain.

An aspect of the present invention also provides a variable gain amplifier having temperature-independent characteristics of a small variation width of a gain, depending on temperature change.

According to an aspect of the present invention, there is provided a variable gain amplifier including: a differential amplification unit amplifying and outputting a difference between a first input signal and a second input signal inputted via a first input terminal and a second input terminal, respectively, according to a first bias current of the first input terminal and second input terminal, to a first output terminal and a second output terminal; a diode-connected load unit comprising loads diode-connected to the first output terminal and second output terminal, respectively, the load receiving a second bias current; and a gain control unit controlling a gain between the input terminals and the output terminals of the differential amplification unit by controlling the size of the first bias current and second bias current.

The differential amplification unit may include: a first n-channel metal-oxide semiconductor (NMOS) transistor having a gate connected to the first input terminal; and a second NMOS transistor having a gate connected to the second input terminal, wherein sources of the first NMOS transistor and second NMOS transistor are connected to each other, the sources to which the first bias current is provided. In this case, drains may be the first and second output terminals of the variable gain amplifier.

The differential amplification unit may further include: a third NMOS transistor having a source connected to a drain of the first NMOS transistor and a drain connected to the first output terminal; and a fourth NMOS transistor having a source connected to a drain of the second NMOS transistor and a drain connected to the second output terminal. In this case, the input terminals of the variable gain amplifier are cathode input terminals in which the first and third NMOS transistors are connected in a cathode structure and the second and fourth NMOS transistors are connected in a cathode structure. The third NMOS transistor and fourth NMOS transistor receive a predetermined bias voltage via gates thereof and operate, respectively.

The first NMOS transistor through fourth NMOS transistor may have an identical ratio of width to length to others, respectively.

The diode-connected load unit may include: a fifth NMOS transistor having a drain connected to the first output terminal and a gate mutually connected to the drain; and a sixth NMOS transistor having a drain connected to the second output terminal and a gate mutually connected to the drain, wherein sources of the fifth NMOS transistor and sixth NMOS transistor are connected to each other, the sources to which the second bias current is provided. The first NMOS transistor, second NMOS transistor, fifth NMOS transistor, and sixth NMOS transistor may have an identical ratio of width to length to others, respectively.

The gain control unit may include: a first current source connected between the sources of the first NMOS transistor and second NMOS transistor and a ground; a seventh NMOS transistor having a drain connected to the sources of the first NMOS transistor and second NMOS transistor and having a source connected to the ground; a second current source connected between the sources of the fifth NMOS transistor and sixth NMOS transistor and the ground; and an eighth NMOS transistor having a drain connected to the sources of the fifth NMOS transistor and sixth NMOS transistor and having a source connected to the ground, wherein a sum of the bias voltage and a variable control voltage is provided to a gate of the seventh NMOS transistor, a difference between the bias voltage and the control voltage is provided to a gate of the eighth NMOS transistor, and currents generated by the first current source and second current source have a size identical to each other. The first bias current of the differential amplification unit may be determined by the first current source and the seventh NMOS transistor, and the second bias current of the diode-connected load unit may be determined by the second current source and the eighth NMOS transistor.

The variable gain amplifier may further include a first active-inductive load and a second active-inductive load connected to the first output terminal and second output terminal, respectively.

The first active-inductive load may include: a ninth NMOS transistor having a drain connected to a supply voltage source and a gate connected to the first output terminal; a first p-channel metal-oxide semiconductor (PMOS) transistor having a source connected to the supply voltage source, a drain connected to the first output terminal, and a gate connected to a source of the ninth NMOS transistor; a first capacitor connected between the source of the ninth NMOS transistor and a ground; and a third current source supplying a current to the source of the ninth NMOS transistor.

The second active-inductive load may include: a tenth NMOS transistor having a drain connected to a supply voltage source and a gate connected to the second output terminal; a second PMOS transistor having a source connected to the supply voltage source, a drain connected to the second output terminal, and a gate connected to a source of the tenth NMOS transistor; a second capacitor connected between the source of the tenth NMOS transistor and a ground; and a fourth current source supplying a current to the source of the tenth NMOS transistor.

To provide a temperature-independent gain, the first current source and second current source may generate a current decreased as temperature increases.

To embody the temperature-independent gain the first current source and second current source may include: a third PMOS transistor having a source connected to a supply voltage; a fourth PMOS transistor having a source connected to the supply voltage and a gate and drain connected to a gate of the third PMOS transistor; an eleventh NMOS transistor having a gate and drain connected to a drain of the third PMOS transistor and a grounded source; a twelfth NMOS transistor having a drain connected to the drain of the fourth PMOS transistor and a gate connected to the gate of the eleventh NMOS transistor; a first resistor connected between a source of the twelfth NMOS transistor and a ground and having a resistance value increasing as temperature increases; a thirteenth NMOS transistor having a gate connected to the gate of the eleventh NMOS transistor and a grounded source; and a fourteenth NMOS transistor having a gate connected to the gate of the eleventh NMOS transistor and a grounded source, wherein drain currents of the thirteenth and fourteenth NMOS transistors are provided as the current generated by the first current source and second current source.

The first current source and second current source may include: a temperature-independent current source generating a uniform current unchanged by a change in temperature; a fifth PMOS transistor having a source connected to a supply voltage; a sixth PMOS transistor having a source connected to the supply voltage and a gate and drain connected to a gate of the fifth PMOS transistor; a fifteenth NMOS transistor having a gate and drain connected to a drain of the fifth PMOS transistor and a grounded source; a sixteenth NMOS transistor having a drain connected to the drain of the sixth PMOS transistor and a gate connected to the gate of the fifteenth NMOS transistor; a second resistor connected between a source of the sixteenth NMOS transistor and a ground and having a resistance value decreasing as temperature increases; a seventeenth NMOS transistor receiving the current generated by the temperature-independent current source and having a gate connected to the gate of the fifteenth NMOS transistor and a grounded source; an eighteenth NMOS transistor having a drain and gate connected to a drain of the seventeenth NMOS transistor and a grounded source; a nineteenth NMOS transistor having a gate connected to the gate of the eighteenth NMOS transistor and a grounded source; and a twentieth NMOS transistor having a gate connected to the gate of the eighteenth NMOS transistor and a grounded source, wherein drain currents of the nineteenth and twentieth NMOS transistors are provided as the current generated by the first current source and second current source.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 3:
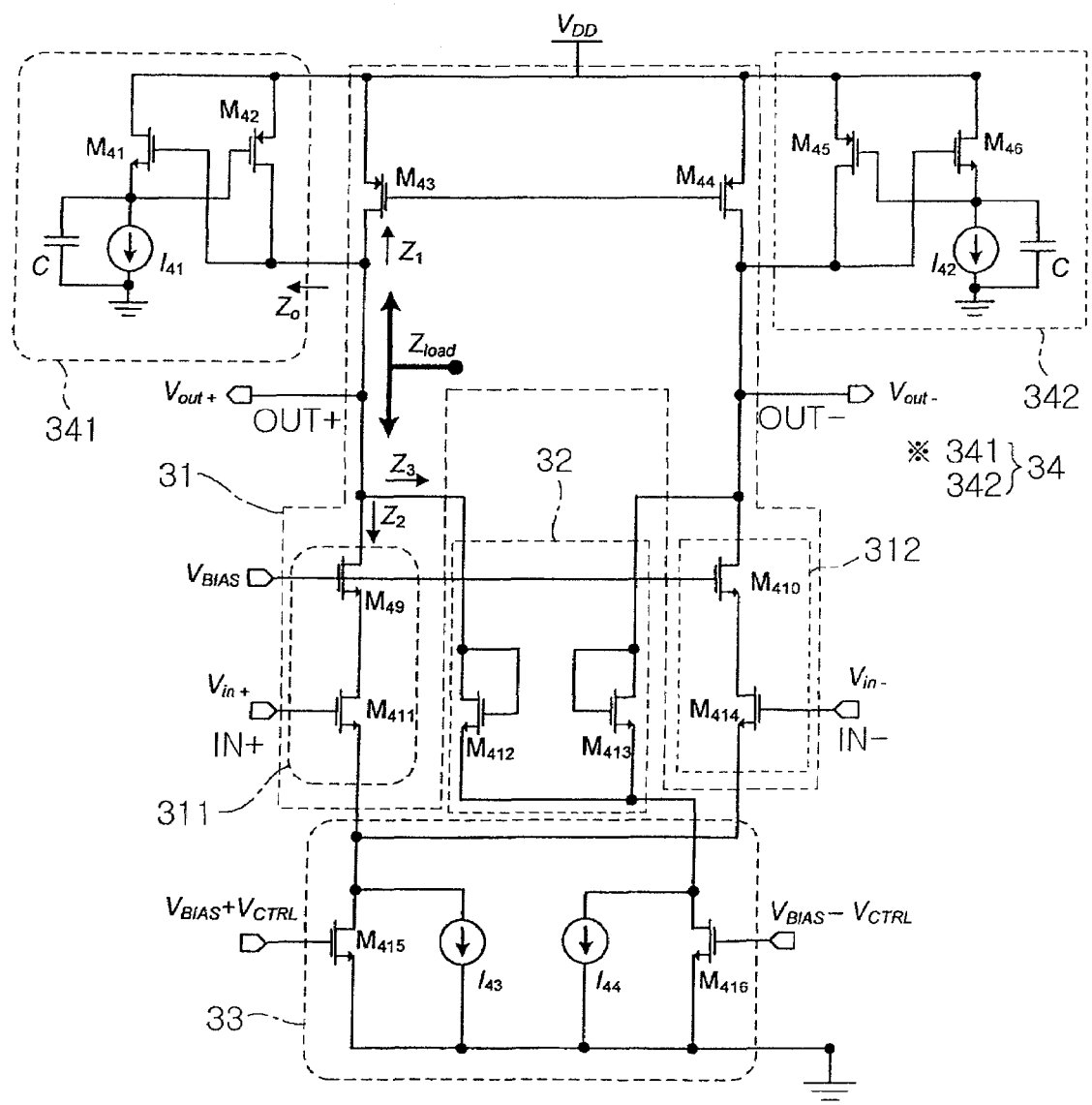
FIG. 3 is a circuit diagram illustrating a variable gain amplifier according to an exemplary embodiment of the present invention.

FIG. 3 is a circuit diagram illustrating a variable gain amplifier according to an exemplary embodiment of the present invention.

Referring to FIG. 3, the variable gain amplifier includes a differential amplification unit 31, a diode-connected load unit 32, a gain control unit 33, and an active-inductive load unit 34.

The differential amplification unit 31 amplifies and outputs a difference between a first input signal Vin+ and a second input signal Vin−, inputted via a first input terminal IN+ and a second input terminal IN−, respectively, according to a first bias current of the first input terminal IN+ and second input terminal IN−, to a first output terminal OUT+ and a second output terminal OUT−.

In detail, the differential amplification unit 31 includes a first n-channel metal-oxide semiconductor (NMOS) transistor M411 having a gate connected to the first input terminal IN+; and a second NMOS transistor M414 having a gate connected to the second input terminal IN−, wherein sources of the first NMOS transistor M411 and second NMOS transistor M414 may be connected to each other, the sources to which the first bias current is provided. In this case, drains of the first NMOS transistor M411 and second NMOS transistor M414 may be the first output terminal OUT+ and second output terminal OUT− of the variable gain amplifier, respectively.

On the other hand, to embody a wide bandwidth, the variable gain amplifier may include an input unit 311 in a cathode structure. The input unit 311 has a structure further including an NMOS transistor operated by a predetermined bias voltage $V_{BIAS}$, between the first and second NMOS transistors M411 and M414 and the first and second output terminals OUT+ and OUT−. That is, the differential amplification unit 311 having the input unit 311 in the cathode structure may further include a third NMOS transistor M49 having a source connected to a drain of the first NMOS transistor M411 and a drain connected to the first output terminal OUT+; and a fourth NMOS transistor M410 having a source connected to a drain of the second NMOS transistor M414 and a drain connected to the second output terminal OUT−. The third NMOS transistor M49 and fourth NMOS transistor M410 may have an identical ratio W/L of width W to length L to each other, respectively.

The diode-connected load unit 32 includes loads diode-connected to the first and second output terminals OUT+ and OUT−, respectively. A second bias current is provided to the loads.

The diode-connected load unit 32 may include: a fifth NMOS transistor M412 having a drain connected to the first output terminal OUT+ and a gate mutually connected to the drain; and a sixth NMOS transistor M413 having a drain connected to the second output terminal OUT− and a gate mutually connected to the drain, wherein sources of the fifth NMOS transistor M412 and sixth NMOS transistor M413 may be connected to each other, the sources to which the second bias current is provided. The first NMOS transistor M411, second NMOS transistor M414, fifth NMOS transistor M412, and sixth NMOS transistor M413 may have an identical ratio W/L of width W to length L to others, respectively.

The gain control unit 33 controls a gain of the variable gain amplifier, which is a gain between the input terminals and the output terminals of the differential amplification unit 32, by controlling the size of the first bias current and second bias current provided to the differential amplification unit 31 and the diode-connected load unit 32.

In the present embodiment, the gain control unit 33 may include a first current source $I_{43}$ connected between the sources of the first NMOS transistor M411 and second NMOS transistor M414 and a ground; a seventh NMOS transistor M415 having a drain connected to the sources of the first NMOS transistor M411 and second NMOS transistor M414 and having a source connected to the ground; a second current source $I_{44}$ connected between the sources of the fifth NMOS transistor M412 and sixth NMOS transistor M413 and the ground; and an eighth NMOS transistor M416 having a drain connected to the sources of the fifth NMOS transistor M412 and sixth NMOS transistor M413 and having a source connected to the ground.

A sum of the bias voltage and a variable control voltage are provided to a gate of the seventh NMOS transistor M415, and a difference between the bias voltage and the control voltage are provided to a gate of the eighth NMOS transistor M416. The first bias current of the differential amplification unit 31 may be determined by the first current source $I_{43}$ and the seventh NMOS transistor M415, and the second bias current of the diode-connected load unit 32 may be determined by the second current source and the eighth NMOS transistor M416. In the variable gain amplifier according to an exemplary embodiment of the present invention, a gain thereof is controlled by providing the first and second bias currents controlled by the gain control unit 33 according to a control voltage $V_{CRTL}$ to the differential amplification unit 31 and the diode-connected load unit 32.

The active-inductive load unit 34 includes a first active-inductive load 341 and a second active-inductive load 342 connected to the first output terminal OUT+ and second output terminal OUT−, respectively.

The first active-inductive load 341 may include: a ninth NMOS transistor M41 having a drain connected to a supply voltage source $V_{DD}$ and a gate connected to the first output terminal OUT+; a first p-channel metal-oxide semiconductor (PMOS) transistor M42 having a source connected to the supply voltage source $V_{DD}$, a drain connected to the first output terminal OUT+, and a gate connected to a source of the ninth NMOS transistor M41; a first capacitor C1 connected between the source of the ninth NMOS transistor M41 and a ground; and a third current source $I_{41}$ supplying a current to the source of the ninth NMOS transistor M41.

The second active-inductive load 342 has a symmetrical structure to the first active-inductive load 341. The second active-inductive load 342 may include: an tenth NMOS transistor M46 having a drain connected to a supply voltage source $V_{DD}$ and a gate connected to the second output terminal OUT−; a second PMOS transistor M45 having a source connected to the supply voltage source $V_{DD}$, a drain connected to the second output terminal OUT−, and a gate connected to a source of the tenth NMOS transistor M46; a second capacitor C2 connected between the source of the tenth NMOS transistor M46 and a ground; and a fourth current source $I_{42}$ supplying a current to the source of the tenth NMOS transistor M46.

Hereinafter, the operation of the variable gain amplifier according to an exemplary embodiment of the present invention will be described in detail with reference to the attached drawings. An operation of extending a section of linear variation of a gain in the variable gain amplifier will be described, and an operation of extending a bandwidth will be described.

Figure 1:
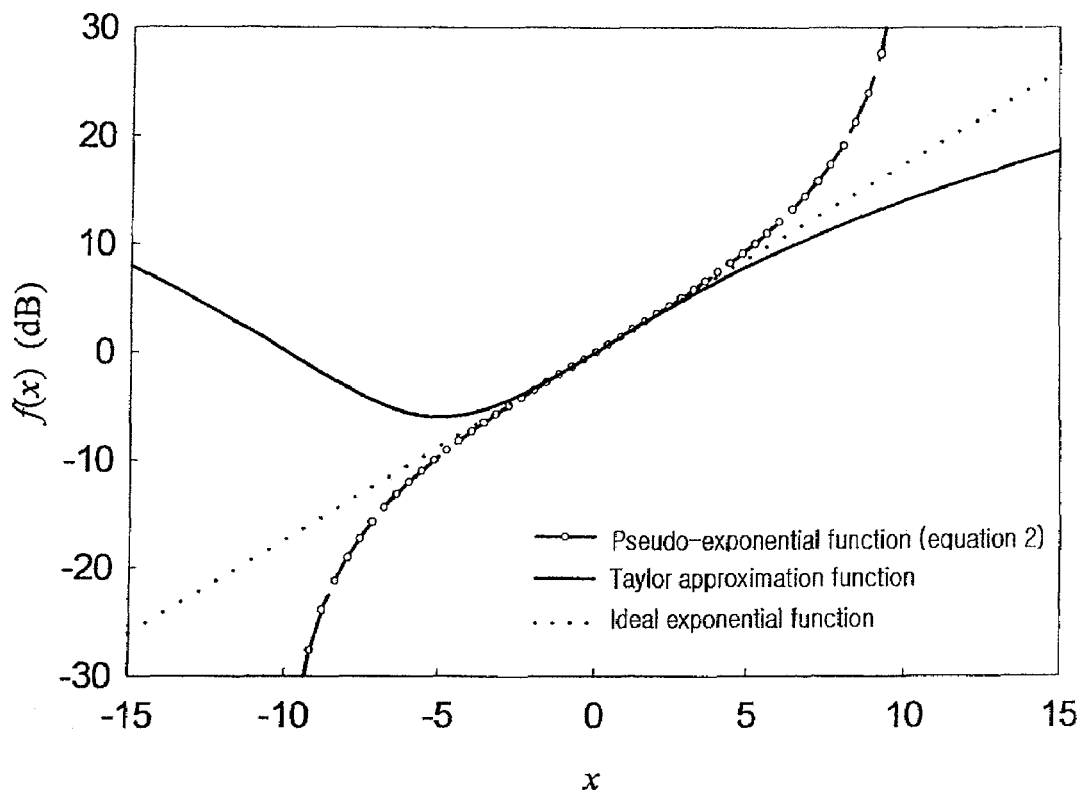
FIG. 1 is a graph illustrating approximated exponential equations applied to a gain variation width of a conventional variable gain amplifier.
Figure 2:
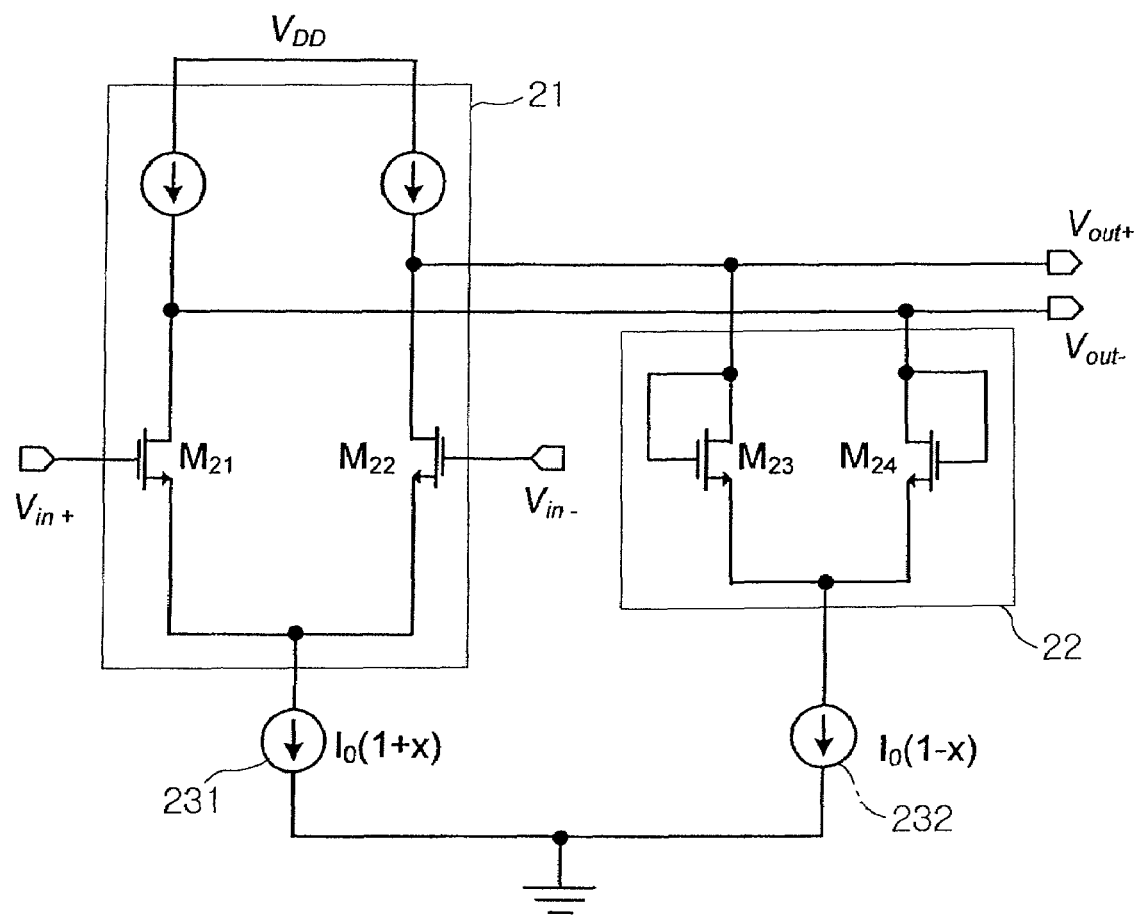
FIG. 2 is a circuit diagram illustrating a conventional variable gain amplifier.

To solve the problem of the conventional variable gain amplifier embodied by an approximated exponential function described with reference to FIG. 1, the present invention provides a new approximate exponential function. Equation 4 is a new approximate exponential function provided by the present invention.

$$f(x) = \frac{k + (1-ax)^2}{k + (1-ax)^2} \quad \text{Equation 4}$$

Figure 4:
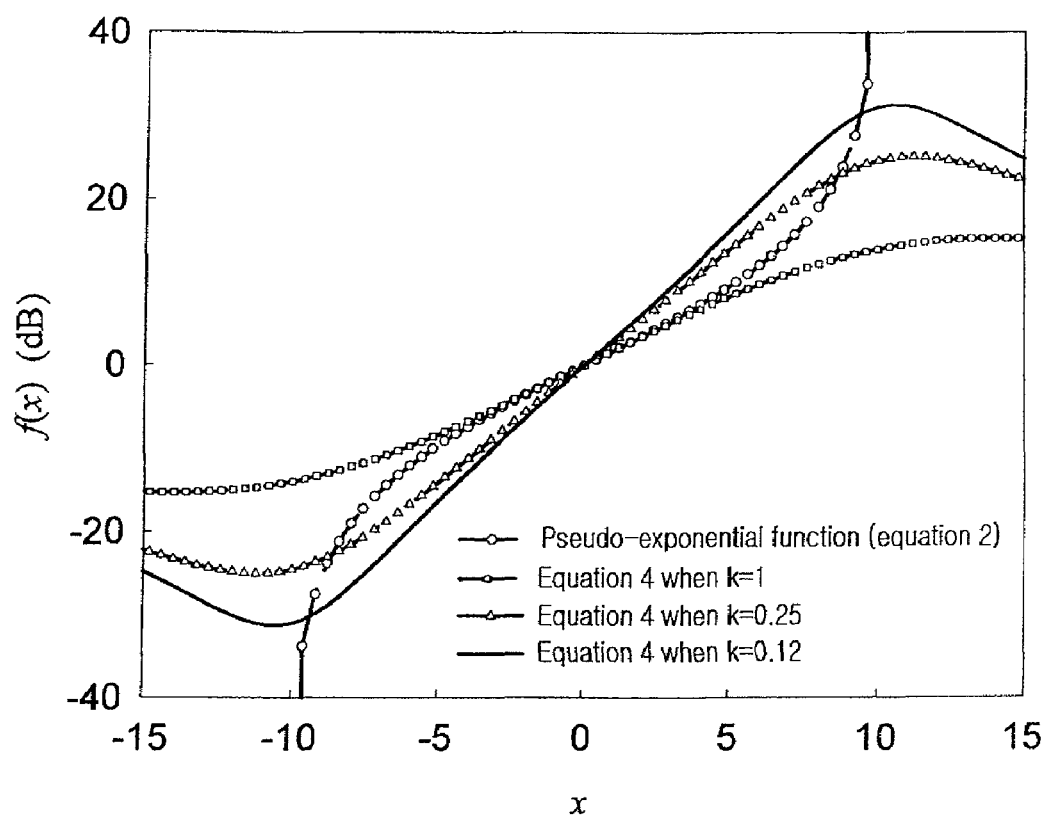
FIG. 4 is a graph comparatively illustrating an approximated exponential equation applied to a gain variation width of the variable gain amplifier according to an exemplary embodiment of the present invention and a conventional approximated exponential equation.

In Equation 4, k and a are constants and x is an independent variable. FIG. 4 is a graph illustrating a dB scale of Equation 4, depending on a change of a value of k. Referring to FIG. 4, when k=1, Equation 4 provides a linear section of about 20 dB, having a linear error less than ±0.5 dB. When k is smaller than 1, the dB-linear section according to Equation 4 is rapidly increased. When k=0.12, a dB-linear section more than 60 dB may be provided. When comparing with linear sections according to Equation 1 and Equation 2 shown in FIG. 1, the dB-linear section of a gain variation width of the variable gain amplifier may be improved by 45 to 48 dB when using Equation 4. Accordingly, the variable gain amplifier employing Equation 4 may provide a dB-linear gain more than 60 dB. A dB-linear gain variation may be much improved in comparison with the conventional variable gain amplifier of a stage employing Equations 1 and 2.

FIG. 3 is a circuit diagram illustrating the variable gain amplifier employing Equation 4. In FIG. 3, the first bias current of the first and second NMOS transistors M411 and M414 connected to the input terminals of the differential amplification unit 31 and the second bias current of the fifth and sixth NMOS transistors M412 and M413 of the diode-connected load unit 32 are controlled by external voltages $V_{BIAS}+V_{CTRL}$ and $V_{BIAS}-V_{CTRL}$ of the gain control unit 33, respectively. In this case, the voltage $V_{BIAS}$ is a direct current (DC) bias voltage with a fixed size and the voltage $V_{CTRL}$ is a control voltage controlled to determine a desired gain. The first bias current and the second bias current are defined as Equations 5 and 6, respectively.

$$I_{M411,414} = \frac{1}{2}\mu_n C_{OX} \frac{W}{L}(V_{BIAS} + V_{CTRL} - V_{th})^2 + I_{43} \quad \text{Equation 5}$$

$$I_{M412,413} = \frac{1}{2}\mu_n C_{OX} \frac{W}{L}(V_{BIAS} - V_{CTRL} - V_{th})^2 + I_{44} \quad \text{Equation 6}$$

wherein $I_{M411,414}$ is a current of one of the first NMOS transistor M411 and the second NMOS transistor M414, that is, the first bias current and $I_{M412,413}$ is a current of one of the fifth NMOS transistor M412 and the sixth NMOS transistor M413, that is, the second bias current. Also, $\mu_n$ is a mobility of electrons in an NMOS transistor, $C_{OX}$ is a capacitance per unit area of a capacitor formed of a gate terminal and a semiconductor layer in the NMOS transistor, $V_{th}$ is a threshold voltage of the NMOS transistor, and $I_{43}$ and $I_{44}$ are sizes of currents provided from current sources $I_{43}$ and $I_{44}$ included in the gain control unit 33, which have an identical size to each other.

On the other hand, similar to Equation 3, the gain of the variable gain amplifier according to an exemplary embodiment of the present invention may be determined as shown in Equation 7.

$$A_V = \frac{g_{m-M411,414}}{g_{m-M412,413}} = \sqrt{\frac{(W/L)_{M411,414} I_{M411,414}}{(W/L)_{M412,413} I_{M412,413}}} \quad \text{Equation 7}$$

wherein $g_{m-M411,414}$ is a transconductance of the first and second NMOS transistors M411 and M414, $g_{m-M412,413}$ is a transconductance of the fifth and sixth NMOS transistors M412 and M413 of the diode-connected load unit 32, (W/L)$_{M411,414}$ is a ratio of width to length of the first and second NMOS transistors M411 and M414, and (W/L)$_{M412,413}$ is a ratio of area to width of the fifth and sixth NMOS transistors M412 and M413.

When (W/L)$_{M411,414}$=(W/L)$_{M412,413}$ in Equation 7 and Equations 5 and 6 are substituted for Equation 7, the gain of the variable gain amplifier according to an exemplary embodiment of the present invention may be expressed as Equation 8.

$$A_V = \left(\frac{\frac{1}{2}\mu_n C_{OX}\frac{W}{L}(V_{BIAS}+V_{CTRL}-V_{th})^2 + I_{43}}{\frac{1}{2}\mu_n C_{OX}\frac{W}{L}(V_{BIAS}-V_{CTRL}-V_{th})^2 + I_{43}}\right)^{1/2}$$

$$= \left(\frac{\frac{I_{43}}{K(V_{BIAS}-V_{th})^2} + \left(1+\frac{V_{CTRL}}{V_{BIAS}-V_{th}}\right)^2}{\frac{I_{43}}{K(V_{BIAS}-V_{th})^2} + \left(1+\frac{V_{CTRL}}{V_{BIAS}-V_{th}}\right)^2}\right)^{1/2}$$

$$= \left(\frac{k+(1+ax)^2}{k+(1-ax)^2}\right)^{1/2}$$

Equation 8 wherein k=$I_{43}$/k($V_{BIAS}-V_{th}$)$^2$, a=1/($V_{BIAS}-V_{th}$), x=$V_{CTRL}$, and K=$\mu_n C_{OX}W/2L$. That is, the variable gain amplifier according to an exemplary embodiment of the present invention has a form as Equation 4 that is the new approximate exponential equation provided by the present invention. In Equation 8, since K, $V_{BIAS}$, and $V_{th}$ are fixed value determined by physical characteristics of one of the first, second, fifth, and sixth NMOS transistors M411, M414, M412, and M413, when the current size $I_{43}$ of the first and second current sources $I_{43}$ and $I_{44}$ included in the gain control unit 33 of the variable gain amplifier is adjusted as K=0.12, x, that is, a size of the control voltage $V_{CTRL}$ is adjusted and thus the gain of the variable gain amplifier may provide the linear variation section more than 60 dB as shown in FIG. 4 though applying a single amplifying stage.

Hereinafter, the operation of extending a bandwidth, performed by the variable gain amplifier according to an exemplary embodiment of the present invention, will be described.

As described above, the differential amplification unit 31 included in the variable gain amplifier according to an exemplary embodiment of the present invention has the input unit 311 in the cathode structure. In the input unit 311, when a ratio of width W to length L of each of the first through fourth NMOS transistors M411, M414, M49, and M410 is determined identically to others, that is, as (W/L)$_{M49}$=(W/L)$_{M410}$=(W/L)$_{M411}$=(W/L)$_{M414}$, a differential gain ($g_{m-M411}$/$g_{m-M49}$) from the first and second input terminals IN+ and IN− to drains of the first and second NMOS transistors M411 and M414 becomes 1. Accordingly, a Miller multiplication becomes reduced and thus an input capacitance becomes a minimum value. As a result, the bandwidth in which the variable gain amplifier operates is more increased by moving to a frequency with a higher input pole.

Also, to extend the bandwidth, the variable gain amplifier includes the active-inductive load unit 34. The active-inductive load unit 34 includes the first active-inductive load 341 and the second active-inductive load 342 at the first output terminal OUT+ and the second output terminal OUT−, respectively.

Considering an operation of the first active-inductive load 341, the first PMOS transistor M42 operates as a load. The ninth NMOS transistor M41 forms a mutual negative feedback together with the first PMOS transistor M42 operating as a load. Also, since a stable bias current is determined by size of the first PMOS transistor M42 and ninth NMOS transistor M41 and the third current source $I_{41}$ in the first active-inductive load 341, common mode rejection ratio (CMRR) is increased in comparison with a case of using a resistor as a load. Accordingly, an output voltage $V_{OUT+}$ outputted via the first output terminal OUT+ is maintained as more stable voltage level in an aspect of a direct current. The first capacitor C1 allows the first output terminal OUT+ to have "zero" to improve frequency characteristics. That is, the bandwidth of the variable gain amplifier is extended. Accordingly, when controlling a size of the first capacitor C1, a desired gain may be obtained at a desired operation frequency. The operation is performed identically by the tenth NMOS transistor M46, the second PMOS transistor M45, the fourth current source $I_{42}$, and the second capacitor C2 in the second active-inductive load 342.

In detail, an impedance caused by the first active-inductive load 341 may be expressed as shown in Equation 9.

$$Z_0 \cong \frac{1}{g_{m-M42}}\left(1+\frac{s}{g_{m-M41}/C1}\right)$$

Equation 9

Figure 5:
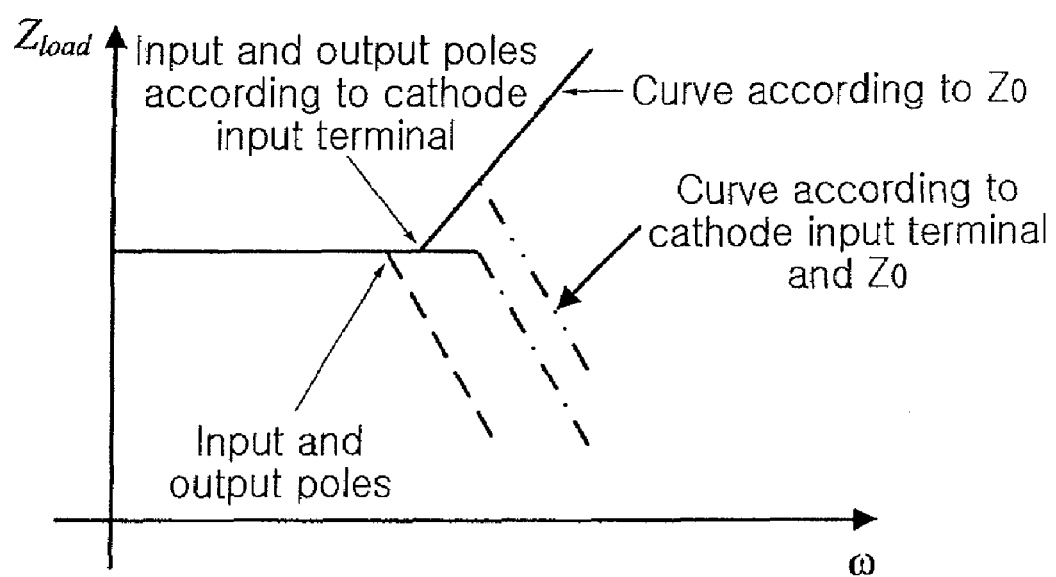
FIG. 5 is a graph illustrating an extended bandwidth of the variable gain amplifier according to an exemplary embodiment of the present invention.

Equation 9 indicates that "zero" is shown at the first output terminal OUT+ by the first active-inductive load. This cause extension of the bandwidth by removing "pole" from the first output terminal OUT+. In FIG. 5, this bandwidth extension principal is illustrated. FIG. 5 is a graph illustrating an extended bandwidth of the variable gain amplifier according to an exemplary embodiment of the present invention.

In FIG. 5, a dotted line indicates frequency characteristics of input-output poles in a general variable gain amplifier. As described above, a position of a pole is moved to a high frequency band by the input unit 311 of the cathode structure applied to the variable gain amplifier according to an exemplary embodiment of the present invention. This is shown as a dashed-dotted line in FIG. 5. On the other hand, a curve is upward by "zero" by the active-inductive load unit 34. Accordingly, though meeting the pole moved by the input unit 311 of the cathode structure, a wider bandwidth may be provided, which is shown as an alternate long and two short dashes line in FIG. 5.

As described above, according to an exemplary embodiment of the present invention, a wide-linear gain variation section of 60 dB to maximum may be provided by a single-wide stage. Though a gain becomes larger, it may be prevented that a frequency bandwidth becomes narrow.

On the other hand, in Equation 8 showing the gain of the variable gain amplifier according to an exemplary embodiment of the present invention, the threshold voltage $V_{th}$, the electron mobility $\mu_n$, and current size $I_{43}$ of the first and second current sources $I_{43}$ and $I_{44}$ vary with temperature and thus have an effect on an overall gain curve. When "a" is considered as a (T)=$\alpha$ (T) $a_{T=T0}$ in which $\alpha$(T) is a temperature coefficient of "a", Equation 8 is changed into Equation 10.

$$A_V = \sqrt{\frac{\frac{I_{43}a_{T=T0}^2}{K}\alpha^2(T) + [1+\alpha(T)a_{T=T0}x]^2}{\frac{I_{43}a_{T=T0}^2}{K}\alpha^2(T) + [1-\alpha(T)a_{T=T0}x]^2}}$$

Equation 10

Figure 6:
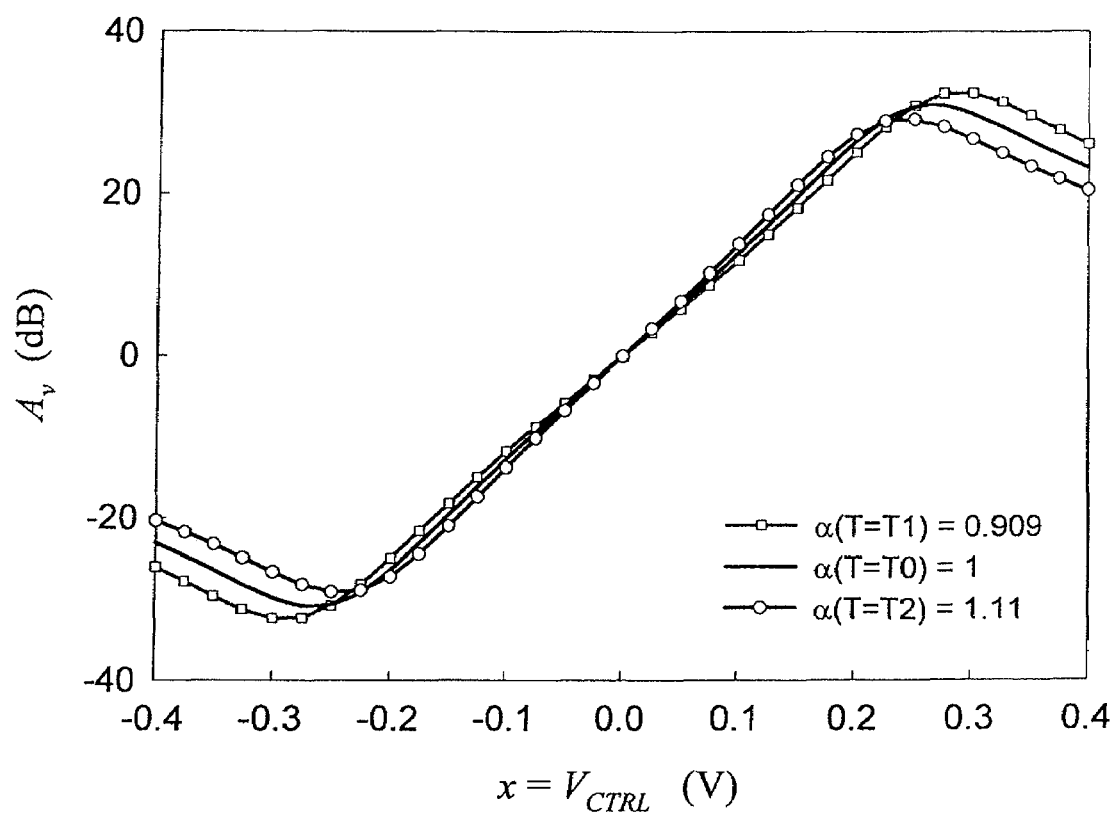
FIG. 6 is a graph illustrating a gain variation of the variable gain amplifier according to an exemplary embodiment of the present invention when a threshold voltage Vth varying with a temperature change.

In Equation 10, it is considered that the electron mobility $\mu_n$ and the current $I_{43}$ of a voltage source have fixed values and the threshold voltage $V_{th}$ varies with temperature. For example, when T=T0, the bias voltage $V_{BIAS}$ is 0.75 V, and the threshold voltage $V_{th}$ is 0.5 V, a value of a constant "a" becomes 4. This is shown as a solid line in FIG. 6. When it is assumed that the threshold voltage $V_{th}$ is changed in a range within ±10%, for example, from 0.45 to 0.55 when temperature is changed in a range from T1 to T2, α(T) that is the temperature coefficient of "a" varies in a range from about 0.909 to 1.111 and an overall gain is changed as shown in FIG. 6. As a result, a temperature-dependent change of the threshold voltage $V_{th}$ causes a change of the overall gain.

It is considered that the threshold voltage $V_{th}$ and $I_{43}$ the current size $I_{43}$ of the first and second current sources /K vary with temperature. In this case, $I_{43}$/K may be determined to be a value varying with temperature. This is, it may be shown as $I_{43}/K(T)=\gamma(T)(I_{43}/K)_{T=T0}$ in which γ(T) is a temperature coefficient of $I_{43}$. Accordingly, when the threshold voltage $V_{th}$ and $I_{43}$/K are vary with temperature, Equation 8 may be expressed as Equation 11.

$$A_V = \sqrt{\frac{\left(\frac{I_{43}a^2}{K}\right)_{T=T0}\gamma(T)a^2(T) + [1 + \alpha(T)a_{T=T0}x]^2}{\left(\frac{I_{43}a^2}{K}\right)_{T=T0}\gamma(T)a^2(T) + [1 - \alpha(T)a_{T=T0}x]^2}} \quad \text{Equation 11}$$

In Equation 11, since the electron mobility $\mu_n$ is a decreasing function according to temperature and therefore K becomes a decreasing function according to temperature, $K=\mu_n C_{OX}W/2L$. Also, γ(T) that is a temperature coefficient of $I_{43}$ may have one of positive (+) characteristics and negative (−) characteristics. A temperature-dependent variation of γ(T) has an effect on the gain of the variable gain amplifier by numerical analysis.

Figure 7:
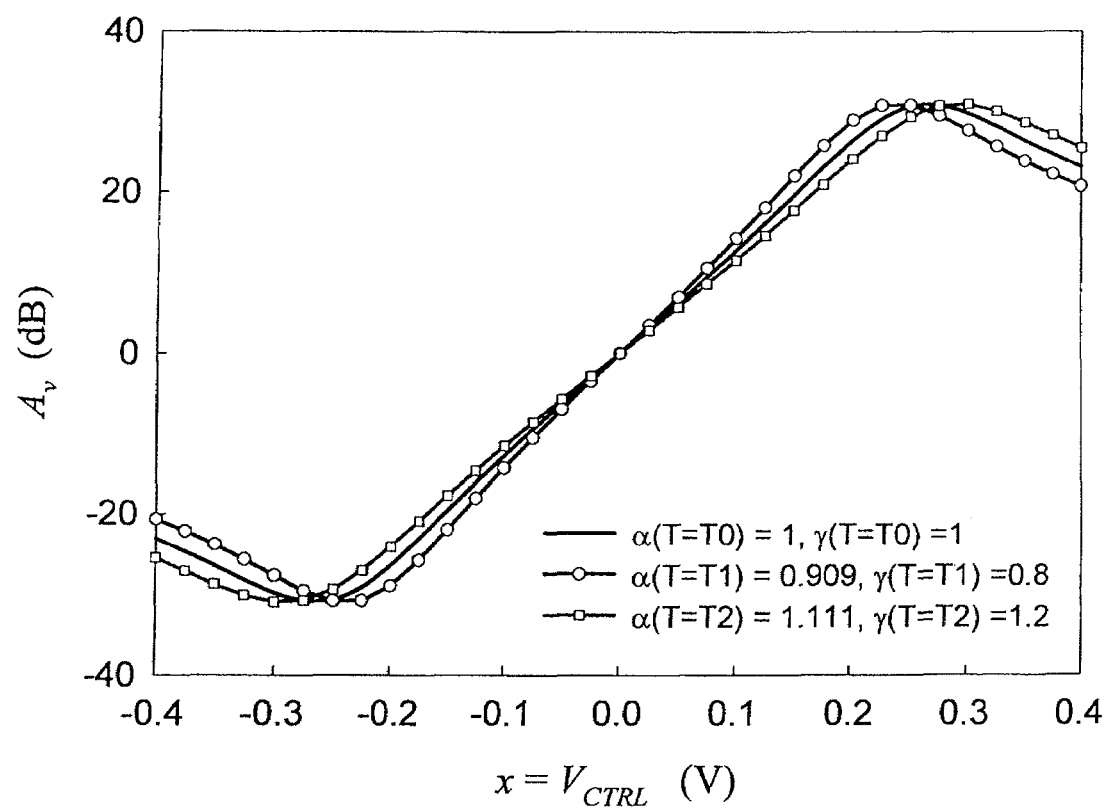
FIG. 7 is graph illustrating a gain variation of the variable gain amplifier according to an exemplary embodiment of the present invention when temperature coefficients γ(T) of a first current source and a second current source are changed as a positive temperature coefficient.

In FIG. 7, a gain variation of the variable gain amplifier, according to temperature, when it is assumed that a temperature is changed in the range from T1 to T2, γ(T) varies by 20% and is a positive temperature coefficient, is shown. As shown in FIG. 7, the gain of the variable gain amplifier is largely changed according to a temperature-dependent variation of γ(T).

Figure 8:
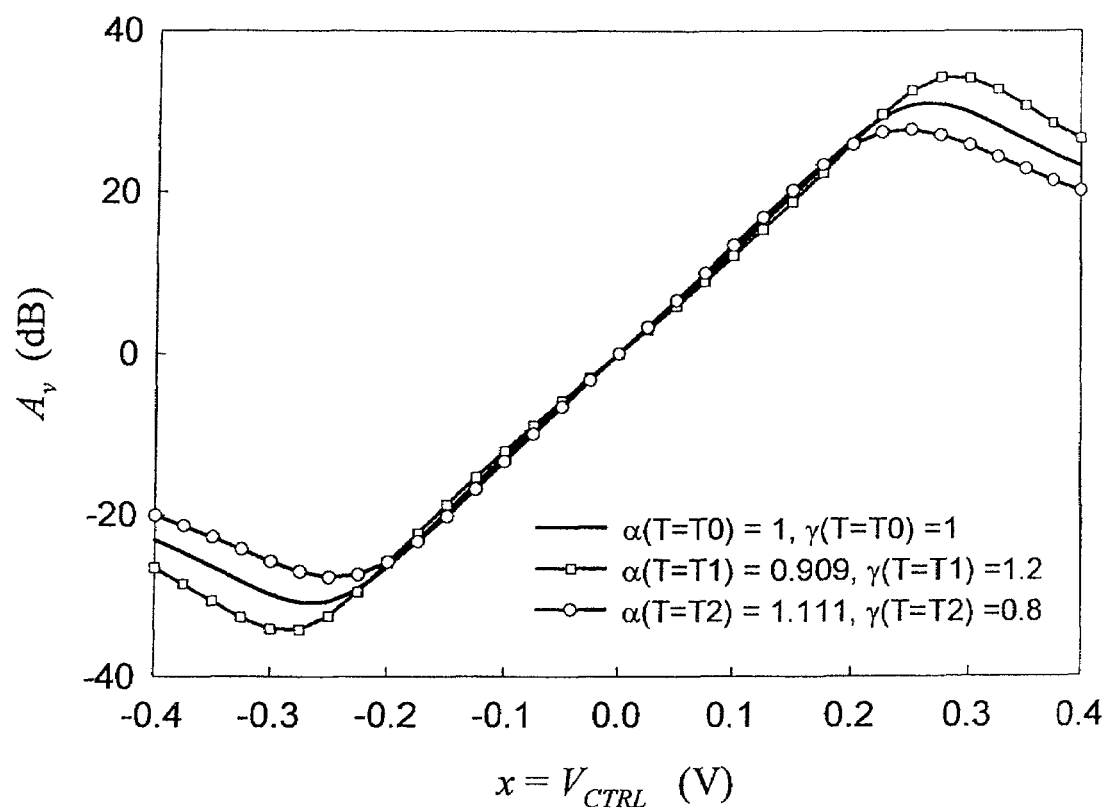
FIG. 8 is graph illustrating a gain variation of the variable gain amplifier according to an exemplary embodiment of the present invention when the temperature coefficients γ(T) of the first current source and the second current source are changed as a negative temperature coefficient.

On the other hand, FIG. 8 illustrates a gain of the variable gain amplifier when γ(T) is a negative temperature coefficient in the same variation range. As shown in FIG. 8, the variable gain amplifier shows temperature-independent characteristics of a small width of a variation according to temperature in a wide gain range. As a result, it may be known that the variable gain amplifier according to an exemplary embodiment of the present invention has excellent temperature-independent characteristics when the first and second current sources $I_{43}$ and $I_{44}$ are decreasing functions according to a temperature variation. That is, when the first and second current sources $I_{43}$ and $I_{44}$ are adjusted to be reduced as temperature increases, the gain of the variable gain amplifier may have the temperature-independent characteristics.

As described above, according to an exemplary embodiment of the present invention, the first and second current sources $I_{43}$ and $I_{44}$ capable of reducing a gain variation width according to temperature are provided by considering a gain variation of the variable gain amplifier, according to temperature.

Figure 9:
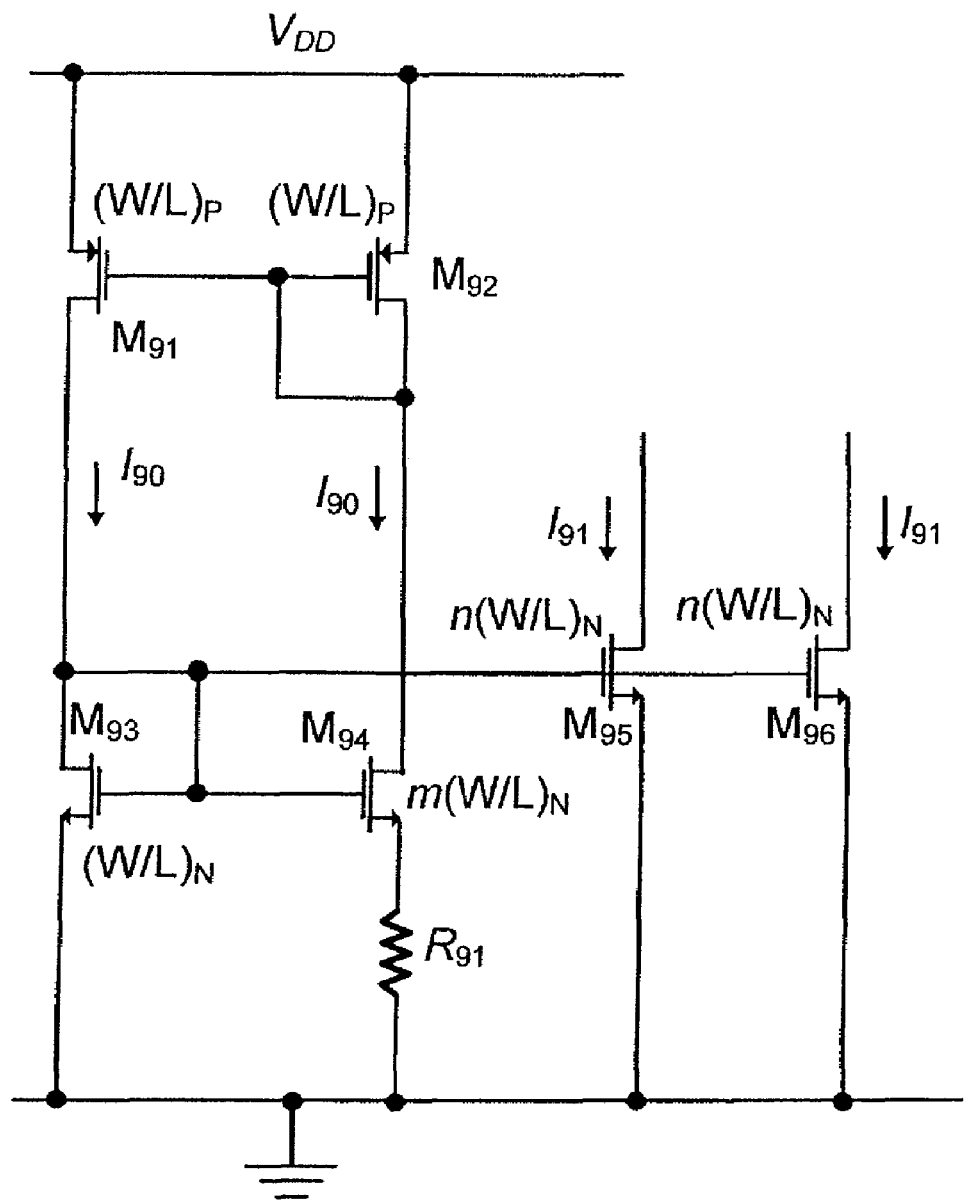
FIGS. 9 and 10 are circuit diagrams illustrating examples of a current source using a resistor having characteristics of an increase a function of increasing according to a temperature, according to an exemplary embodiment of the present invention.

Generally, in the art of complementary metal-oxide semiconductor (CMOS), a threshold voltage $V_{th}$ and an electron mobility $\mu_n$ are decreasing functions of temperature and a resistor is one of an increasing function and decreasing function, depending on temperature. A current source employing a resistor having characteristics of an increasing function of temperature will be described. FIG. 9 is a circuit diagram illustrating the current source employing a resistor having characteristics of an increasing function of temperature, according to an exemplary embodiment of the present invention.

Referring to FIG. 9, the first and second current sources $I_{43}$ and $I_{44}$ have a circuit structure including: a third PMOS transistor M91 having a source connected to a supply voltage $V_{DD}$; a fourth PMOS transistor M92 having a source connected to the supply voltage $V_{DD}$ and a gate and drain connected to a gate of the third PMOS transistor M91; an eleventh NMOS transistor M93 having a gate and drain connected to a drain of the third PMOS transistor M91 and a grounded source; a twelfth NMOS transistor M94 having a drain connected to the drain of the fourth PMOS transistor M92 and a gate connected to the gate of the eleventh NMOS transistor M93; a first resistor $R_{91}$ connected between a source of the twelfth NMOS transistor M94 and a ground and having a resistance value increasing as temperature increases; a thirteenth NMOS transistor M95 having a gate connected to the gate of the eleventh NMOS transistor M93 and a grounded source; and a fourteenth NMOS transistor M96 having a gate connected to the gate of the eleventh NMOS transistor M93 and a grounded source. In this case, drain currents of the thirteenth and fourteenth NMOS transistors M95 and M96 are provided as a current generated by the first current source and second current source.

A current $I_{91}$ generated by the current sources shown in FIG. 9 may be expressed as Equation 12.

$$I_{91} = nI_{90} = n\frac{2}{\mu_n C_{OX}(W/L)_N} \cdot \frac{1}{R_{91}^2}\left(1 - \frac{1}{\sqrt{m}}\right)^2 \quad \text{Equation 12}$$

As shown in Equation 12, since the current $I_{91}$ generated by the current sources shown in FIG. 9 is a function dominantly changed by a value of the resistor $R_{91}$ and the resistor $R_{91}$ has characteristics of an increasing function of temperature, the current $I_{91}$ has a value decreasing as temperature increases. Accordingly, when the current source shown in FIG. 9 is applied to the first and second current sources $I_{43}$ and $I_{44}$ shown in FIG. 3, a current decreasing as temperature increases is provided, thereby embodying a variable gain amplifier having a small gain variation width according to a temperature change.

Figure 10:
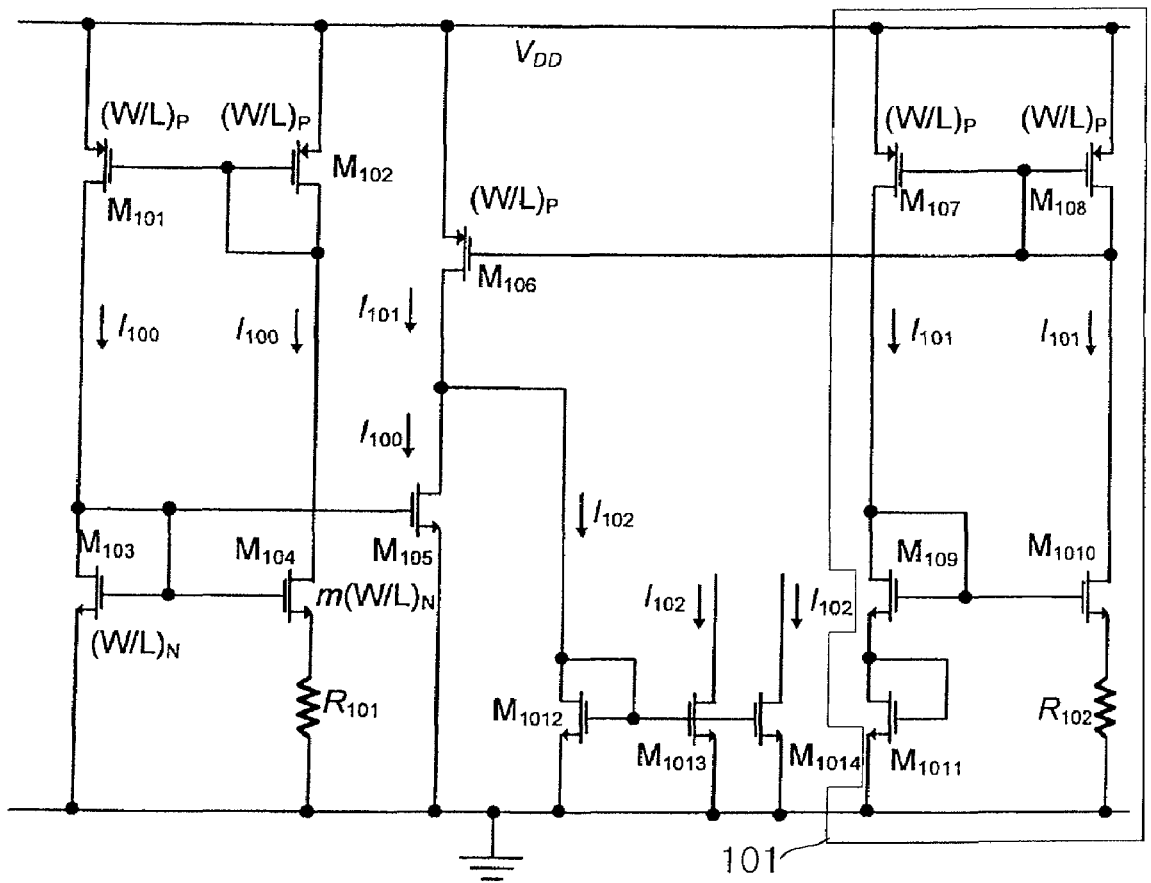

Hereinafter, a current source employing a resistor having characteristics of a decreasing function of temperature will be described. FIG. 10 is a circuit diagram illustrating the current source employing a resistor having a resistance value decreasing depending on temperature.

Referring to FIG. 10, the first and second current sources $I_{43}$ and $I_{44}$ includes a temperature-independent current source 101 generating a uniform current $I_{101}$ unchanged by a change in temperature; a fifth PMOS transistor M101 having a source connected to a supply voltage $V_{DD}$; a sixth PMOS transistor M102 having a source connected to the supply voltage $V_{DD}$ and a gate and drain connected to a gate of the fifth PMOS transistor M101; a fifteenth NMOS transistor M103 having a gate and drain connected to a drain of the fifth PMOS transistor M101 and a grounded source; a sixteenth NMOS transistor M104 having a drain connected to the drain of the sixth PMOS transistor M102 and a gate connected to the gate of the fifteenth NMOS transistor M103; a second resistor $R_{101}$ connected between a source of the sixteenth NMOS transistor M104 and a ground and having a resistance value decreasing as temperature increases; a seventeenth NMOS transistor M105 receiving the current generated by the temperature-independent current source 101 and having a gate connected to the gate of the fifteenth NMOS transistor M103 and a grounded source; an eighteenth NMOS transistor M1012 having a drain and gate connected to a drain of the seventeenth NMOS transistor M105 and a grounded source; a nineteenth NMOS transistor M1013 having a gate connected to the gate of the eighteenth NMOS transistor M1012 and a grounded source; and a twentieth NMOS transistor M1014 having a gate connected to the gate of the eighteenth NMOS transistor M1012 and a grounded source, wherein drain currents of the nineteenth and twentieth NMOS transistors M1013 and M1014 are provided as the current generated by the first current source $I_{43}$ and the second current source $I_{44}$. The temperature-independent current source 101 is formed of a current mirror capable of being embodied by a plurality of PMOS transistors M107 and M108 and a plurality of NMOS transistors N109, M1010, and M1011, and a resistor $R_{102}$.

The current $I_{102}$ generated by the first and second current sources having the circuit structure may be expressed as Equation 13.

$$I_{102} = I_{101} - I_{100} = I_{101} - \frac{2}{\mu_n C_{OX}(W/L)_N} \cdot \frac{1}{R_{101}^2}\left(1 - \frac{1}{\sqrt{m}}\right)^2 \quad \text{Equation 13}$$

As shown in Equation 13, since the electron mobility $\mu_n$ and the resistor $R_{101}$ have a value decreasing as temperature increases, size of a current $I_{100}$ is increased as temperature increases. Accordingly, the current $I_{102}$ generated by the current source of FIG. 10 has a value decreasing as temperature increases. That is, when applying the current source shown in FIG. 10 to the first and second current sources $I_{43}$ and $I_{44}$ shown in FIG. 3, a current decreasing as temperature increases is provided, thereby embodying a variable gain amplifier having a small variation width of a gain, according to a temperature change.

As described above, according to an exemplary embodiment of the present invention, there is provided a variable gain amplifier providing a wide linear gain variation section of about 60 dB to maximum at a single stage by employing an approximate-exponential function of Equation 4.

In addition, though a gain of the variable gain amplifier is determined to be high, a bandwidth may be prevented from being narrow.

Also, the variable gain amplifier may have temperature-independent characteristics capable of maintaining the gain of the variable gain amplifier to be uniform regardless of temperature change.

While the present invention has been shown and described in connection with the exemplary embodiments, it will be apparent to those skilled in the art that modifications and variations can be made without departing from the spirit and scope of the invention as defined by the appended claims.

What is claimed is:

1. A variable gain amplifier, comprising:
   a differential amplification unit amplifying and outputting a difference between a first input signal and a second input signal inputted via a first input terminal and a second input terminal, respectively, according to a first bias current of the first input terminal and second input terminal, to a first output terminal and a second output terminal;
   a diode-connected load unit comprising loads diode-connected to the first output terminal and second output terminal, respectively, the loads receiving a second bias current; and
   a gain control unit controlling a gain between the input terminals and the output terminals of the differential amplification unit by controlling the size of the first bias current and second bias current;
   wherein the diode-connected load unit comprises:
   a fifth n-channel metal-oxide semiconductor transistor having a drain connected to the first output terminal and a gate mutually connected to the drain; and
   a sixth n-channel metal-oxide semiconductor transistor having a drain connected to the second output terminal and a gate mutually connected to the drain,
   wherein sources of the fifth n-channel metal-oxide semiconductor transistor and sixth n-channel metal-oxide semiconductor transistor are connected to each other, and the second bias current is provided to the sources of the fifth and sixth n-channel metal-oxide semiconductor transistors.

2. The amplifier of claim 1, wherein the differential amplification unit comprises:
   a first n-channel metal-oxide semiconductor transistor having a gate connected to the first input terminal; and
   a second n-channel metal-oxide semiconductor transistor having a gate connected to the second input terminal,
   wherein sources of the first n-channel metal-oxide semiconductor transistor and second n-channel metal-oxide semiconductor transistor are connected to each other, and the first bias current is provided to the sources of the first and second n-channel metal-oxide semiconductor transistors.

3. The amplifier of claim 2, wherein the differential amplification unit further comprises:
   a third n-channel metal-oxide semiconductor transistor having a source connected to a drain of the first n-channel metal-oxide semiconductor transistor and a drain connected to the first output terminal; and
   a fourth n-channel metal-oxide semiconductor transistor having a source connected to a drain of the second n-channel metal-oxide semiconductor transistor and a drain connected to the second output terminal,
   wherein the third n-channel metal-oxide semiconductor transistor and fourth n-channel metal-oxide semiconductor transistor receive a predetermined bias voltage via gates thereof.

4. The amplifier of claim 3, wherein the first through fourth n-channel metal-oxide semiconductor transistors have an identical width-to-length ratio.

5. The amplifier of claim 3, wherein the gain control unit comprises:
   a first current source connected between the sources of the first n-channel metal-oxide semiconductor transistor and second n-channel metal-oxide semiconductor transistor and a ground;
   a seventh n-channel metal-oxide semiconductor transistor having a drain connected to the sources of the first n-channel metal-oxide semiconductor transistor and second n-channel metal-oxide semiconductor transistor and having a source connected to the ground;
   a second current source connected between the sources of the fifth n-channel metal-oxide semiconductor transistor and sixth n-channel metal-oxide semiconductor transistor and the ground; and
   an eighth n-channel metal-oxide semiconductor transistor having a drain connected to the sources of the fifth n-channel metal-oxide semiconductor transistor and sixth n-channel metal-oxide semiconductor transistor and having a source connected to the ground, wherein a sum of the bias voltage and a variable control voltage is provided to a gate of the seventh n-channel metal-oxide semiconductor transistor, a difference between the bias voltage and the control voltage is provided to a gate of the eighth n-channel metal-oxide semiconductor transistor, and currents generated by the first current source and second current source have a size identical to each other.

6. The amplifier of claim 2, wherein the first n-channel metal-oxide semiconductor transistor, second n-channel metal-oxide semiconductor transistor, fifth n-channel metal-oxide semiconductor transistor, and sixth n-channel metal-oxide semiconductor transistor have an identical width-to-length ratio.

7. The amplifier of claim 1, further comprising a first active-inductive load and a second active-inductive load connected to the first output terminal and second output terminal, respectively.

8. The amplifier of claim 7, wherein the first active-inductive load comprises:
a ninth n-channel metal-oxide semiconductor transistor having a drain connected to a supply voltage source and a gate connected to the first output terminal;
a first p-channel metal-oxide semiconductor transistor having a source connected to the supply voltage source, a drain connected to the first output terminal, and a gate connected to a source of the ninth n-channel metal-oxide semiconductor transistor;
a first capacitor connected between the source of the ninth n-channel metal-oxide semiconductor transistor and a ground; and
a third current source supplying a current to the source of the ninth n-channel metal-oxide semiconductor transistor.

9. The amplifier of claim 7, wherein the second active-inductive load comprises:
a tenth n-channel metal-oxide semiconductor transistor having a drain connected to a supply voltage source and a gate connected to the second output terminal;
a second p-channel metal-oxide semiconductor transistor having a source connected to the supply voltage source, a drain connected to the second output terminal, and a gate connected to a source of the tenth n-channel metal-oxide semiconductor transistor;
a second capacitor connected between the source of the tenth n-channel metal-oxide semiconductor transistor and a ground; and
a fourth current source supplying a current to the source of the tenth n-channel metal-oxide semiconductor transistor.

10. The amplifier of claim 5, wherein the first current source and second current source generate a current decreased as temperature increases.

11. The amplifier according to claims 5, wherein the first current source and second current source comprise:
a third p-channel metal-oxide semiconductor transistor having a source connected to a supply voltage;
a fourth p-channel metal-oxide semiconductor transistor having a source connected to the supply voltage and a gate and a drain connected to a gate of the third p-channel metal-oxide semiconductor transistor;
an eleventh n-channel metal-oxide semiconductor transistor having a gate and a drain connected to a drain of the third p-channel metal-oxide semiconductor transistor, and a source that is grounded;
a twelfth n-channel metal-oxide semiconductor transistor having a drain connected to the drain of the fourth p-channel metal-oxide semiconductor transistor and a gate connected to the gate of the eleventh n-channel metal-oxide semiconductor transistor;
a first resistor connected between a source of the twelfth n-channel metal-oxide semiconductor transistor and the ground and having a resistance value increasing as temperature increases;
a thirteenth n-channel metal-oxide semiconductor transistor having a gate connected to the gate of the eleventh n-channel metal-oxide semiconductor transistors, and a source that is grounded; and
a fourteenth n-channel metal-oxide semiconductor transistor having a gate connected to the gate of the eleventh n-channel metal-oxide semiconductor transistor, and a source that is grounded,
wherein drain currents of the thirteenth and fourteenth n-channel metal-oxide semiconductor transistors are provided as the current generated by the first current source and second current source.

12. The amplifier according to claim 5, wherein the first current source and second current source comprise:
a temperature-independent current source generating a uniform current unchanged by a change in temperature;
a fifth p-channel metal-oxide semiconductor transistor having a source connected to a supply voltage;
a sixth p-channel metal-oxide semiconductor transistor having a source connected to the supply voltage, and a gate and a drain connected to a gate of the fifth p-channel metal-oxide semiconductor transistor;
a fifteenth n-channel metal-oxide semiconductor transistor having a gate and a drain connected to a drain of the fifth p-channel metal-oxide semiconductor transistor, and a source that is grounded;
a sixteenth n-channel metal-oxide semiconductor transistor having a drain connected to the drain of the sixth p-channel metal-oxide semiconductor transistor and a gate connected to the gate of the fifteenth n-channel metal-oxide semiconductor transistor;
a second resistor connected between a source of the sixteenth n-channel metal-oxide semiconductor transistor and the ground and having a resistance value decreasing as temperature increases;
a seventeenth n-channel metal-oxide semiconductor transistor receiving the current generated by the temperature-independent current source and having a gate connected to the gate of the fifteenth n-channel metal-oxide semiconductor transistor, and a source that is grounded;
an eighteenth n-channel metal-oxide semiconductor transistor having a drain and a gate connected to a drain of the seventeenth n-channel metal-oxide semiconductor transistor, and a source that is grounded;
a nineteenth n-channel metal-oxide semiconductor transistor having a gate connected to the gate of the eighteenth n-channel metal-oxide semiconductor transistor, and a source that is grounded; and
a twentieth n-channel metal-oxide semiconductor transistor having a gate connected to the gate of the eighteenth n-channel metal-oxide semiconductor transistor, and a source that is grounded,
wherein drain currents of the nineteenth and twentieth n-channel metal-oxide semiconductor transistors are provided as the current generated by the first current source and second current source.

13. A variable gain amplifier, comprising:

a differential amplification unit amplifying and outputting a difference between a first input signal and a second input signal inputted via a first input terminal and a second input terminal, respectively, according to a first bias current of the first input terminal and second input terminal, to a first output terminal and a second output terminal;

a diode-connected load unit comprising loads diode-connected to the first output terminal and second output terminal, respectively, the loads receiving a second bias current; and a gain control unit controlling a gain between the input terminals and the output terminals of the differential amplification unit by controlling the size of the first bias current and second bias current;

wherein the differential amplification unit comprises:
  a first n-channel metal-oxide semiconductor transistor having a gate connected to the first input terminal; and
  a second n-channel metal-oxide semiconductor transistor having a gate connected to the second input terminal;

wherein sources of the first and second n-channel metal-oxide semiconductor transistors are connected to each other, and the first bias current is provided to the sources of the first and second n-channel metal-oxide semiconductor transistors;

wherein the differential amplification unit further comprises:
  a third n-channel metal-oxide semiconductor transistor having a source connected to a drain of the first n-channel metal-oxide semiconductor transistor, and a drain connected to the first output terminal; and
  a fourth n-channel metal-oxide semiconductor transistor having a source connected to a drain of the second n-channel metal-oxide semiconductor transistor, and a drain connected to the second output terminal, wherein the third and fourth n-channel metal-oxide semiconductor transistors receive a predetermined bias voltage via gates thereof.

14. The amplifier of claim 13, wherein the first through fourth n-channel metal-oxide semiconductor transistors have an identical width-to-length ratio.

15. A variable gain amplifier, comprising:

a differential amplification unit amplifying and outputting a difference between a first input signal and a second input signal inputted via a first input terminal and a second input terminal, respectively, according to a first bias current of the first input terminal and second input terminal, to a first output terminal and a second output terminal;

a diode-connected load unit comprising loads diode-connected to the first output terminal and second output terminal, respectively, the loads receiving a second bias current;

a gain control unit controlling a gain between the input terminals and the output terminals of the differential amplification unit by controlling the size of the first bias current and second bias current; and a first active-inductive load and a second active-inductive load connected to the first output terminal and second output terminal, respectively;

wherein the first active-inductive load comprises:
  a ninth n-channel metal-oxide semiconductor transistor having a drain connected to a supply voltage and a gate connected to the first output terminal;
  a first p-channel metal-oxide semiconductor transistor having a source connected to the supply voltage, a drain connected to the first output terminal, and a gate connected to a source of the ninth n-channel metal-oxide semiconductor transistor;
  a first capacitor connected between the source of the ninth n-channel metal-oxide semiconductor transistor and a ground; and
  a third current source supplying a current to the source of the ninth n-channel metal-oxide semiconductor transistor.

16. A variable gain amplifier, comprising:

a differential amplification unit amplifying and outputting a difference between a first input signal and a second input signal inputted via a first input terminal and a second input terminal, respectively, according to a first bias current of the first input terminal and second input terminal, to a first output terminal and a second output terminal;

a diode-connected load unit comprising loads diode-connected to the first output terminal and second output terminal, respectively, the loads receiving a second bias current;

a gain control unit controlling a gain between the input terminals and the output terminals of the differential amplification unit by controlling the size of the first bias current and second bias current; and a first active-inductive load and a second active-inductive load connected to the first output terminal and second output terminal, respectively;

wherein the second active-inductive load comprises:
  a tenth n-channel metal-oxide semiconductor transistor having a drain connected to a supply voltage and a gate connected to the second output terminal;
  a second p-channel metal-oxide semiconductor transistor having a source connected to the supply voltage, a drain connected to the second output terminal, and a gate connected to a source of the tenth n-channel metal-oxide semiconductor transistor;
  a second capacitor connected between the source of the tenth n-channel metal-oxide semiconductor transistor and a ground; and
  a fourth current source supplying a current to the source of the tenth n-channel metal-oxide semiconductor transistor.

* * * * *